United States Patent
Harrison et al.

(10) Patent No.: US 6,469,244 B1
(45) Date of Patent: Oct. 22, 2002

(54) EMI CABLE PASSTHROUGH SHIELD

(75) Inventors: Carl G. Harrison, Plano, TX (US); Sheldon L. Rohde, Allen, TX (US)

(73) Assignee: Cisco Technology, Inc., San Jose, CA (US)

(*) Notice: Subject to any disclaimer, the term of this patent is extended or adjusted under 35 U.S.C. 154(b) by 0 days.

(21) Appl. No.: 09/604,646

(22) Filed: Jun. 27, 2000

(51) Int. Cl.$^7$ .................................................. H05K 9/00
(52) U.S. Cl. ................... 174/35 R; 174/65 R; 361/816; 361/818
(58) Field of Search ........................... 174/35 R, 35 GC, 174/35 MS, 65 R; 439/607, 608, 609, 927, 939, 92, 95, 96; 277/920; 361/816, 818

(56) References Cited

U.S. PATENT DOCUMENTS

| | | | |
|---|---|---|---|
| 3,830,954 A | * 8/1974 | Caudill .................. 174/35 MS |
| 4,496,627 A | 1/1985 | Azuma et al. ............... 428/336 |
| 4,696,438 A | 9/1987 | Myers .................... 242/118.41 |
| 4,764,422 A | 8/1988 | Hill et al. .................... 428/309 |
| 4,771,136 A | * 9/1988 | Graver et al. .............. 174/35 R |
| 4,783,954 A | 11/1988 | Akre .............................. 57/9 |
| 4,792,203 A | 12/1988 | Nelson et al. ............. 350/96.2 |
| 4,884,774 A | * 12/1989 | Rodi et al. ..................... 248/56 |
| 4,995,688 A | 2/1991 | Anton et al. ............... 350/96.1 |
| 5,013,121 A | 5/1991 | Anton et al. ............... 350/96.2 |
| 5,066,149 A | 11/1991 | Wheeler et al. ............. 385/135 |
| 5,067,678 A | 11/1991 | Henneberger et al. ..... 248/68.1 |
| 5,179,618 A | 1/1993 | Anton ........................ 385/136 |
| 5,208,894 A | 5/1993 | Johnson et al. ............. 385/135 |
| 5,214,735 A | 5/1993 | Henneberger et al. ...... 385/136 |
| 5,287,426 A | 2/1994 | Shahid ........................ 385/85 |
| 5,301,884 A | 4/1994 | Horneman .................. 242/7.09 |
| 5,316,243 A | 5/1994 | Henneberger et al. ..... 248/68.1 |
| 5,339,379 A | 8/1994 | Kutsch et al. .............. 385/135 |
| 5,497,444 A | 3/1996 | Wheeler ..................... 385/135 |
| 5,511,798 A | * 4/1996 | Kawamoto et al. ......... 277/205 |
| 5,567,740 A | 10/1996 | Free ........................... 521/128 |
| 5,584,983 A | 12/1996 | Pruyn ........................ 205/103 |
| 5,591,482 A | 1/1997 | He et al. .................... 427/244 |
| 5,717,810 A | 2/1998 | Wheeler ..................... 385/135 |
| 5,758,003 A | 5/1998 | Wheeler et al. ............. 385/134 |
| 5,761,368 A | 6/1998 | Arnett et al. ............... 385/134 |
| 5,834,693 A | * 11/1998 | Waddell et al. ........... 174/65 R |
| 5,855,818 A | 1/1999 | Gan et al. ................... 252/511 |
| 5,915,062 A | 6/1999 | Jackson et al. ............. 385/137 |
| 5,946,440 A | 8/1999 | Puetz ........................ 385/135 |
| 6,162,989 A | * 12/2000 | Garner ..................... 174/35 R |

* cited by examiner

Primary Examiner—Dean A. Reichard
Assistant Examiner—Carmelo Oliva
(74) Attorney, Agent, or Firm—Campbell Stephenson Ascolese LLP

(57) ABSTRACT

An EMI cable passthrough shield for a cable opening in an electronic system housing. The EMI cable passthrough shield includes portions made of an electrically conductive, deformable material having cable passageways to receive cable. A plurality of shields can be stacked in a cable opening of an electronic system housing. The shields can be compressed such that the deformable material completely encloses a cable. An example of a deformable electrically conductive material is an electrically conductive elastomeric material.

28 Claims, 7 Drawing Sheets

EMI CABLE PASSTHROUGH SHIELD

BACKGROUND OF THE INVENTION

1. Field of the Invention

This invention relates in general to electronic equipment and more specifically to EMI shielding for cable openings in electronic equipment housings.

2. Description of the Related Art

Communication system equipment and other types of electronic system equipment are required to meet rigid electromagnetic interference (EMI) emissions standards. In an ideal design, the electronic components of a communication system would be totally enclosed in an electrically conductive enclosure with no openings. However, due to a number of constraints including temperature considerations and data input and output, numerous openings are required in a communications system housing. Preferably, these openings should be minimized to reduce EMI emissions from a communications system.

Communication system equipment may utilize hundreds of fiber optic cables and other cables for providing data input and output to the system. To accommodate such a large number of cables, some system housings include large holes for multiple cables to pass through. However, providing large cable openings allows EMI emissions to pass through as well. Furthermore, communication systems typically include circuits operating at high frequencies which produce high frequency emissions. In order to block high frequency emissions, a communication system housing needs to have smaller openings.

One method for minimizing EMI emissions due to cable openings in a communication system housing is to provide an individual cable opening in the housing for each cable. However, one problem with this technique is that the cables may chaff at the sharp edged, entry points of the individual openings. Also, the number of individual holes that can be made is limited by the surface area of the housing.

Another solution for minimizing EMI emissions is to mount individual passthrough connectors in the housing for signals to pass through the housing. The signals of a cable are carried to the connector by a cable connected to the connector on the outer side of the housing and to the connector by a cable connected to the connector on the inner side of the housing. However, pass through connectors add expense to a communication system and take up space on the housing panels.

What is needed is an improved technique for reducing EMI emissions due to cable openings in electronic system housings.

SUMMARY OF THE INVENTION

Providing an electronic system housing with an EMI shield having deformable, electrically conductive material to define cable passageways advantageously provides EMI shielding for cable openings in an electronic system housing.

In one aspect, the invention includes an EMI shield having cable passageways. An EMI shield includes at least one portion made of a deformable electrically conductive material. The at least one portion defines a plurality of cable passageways extending from a first side of the at least one portion to a second side of the at least one portion. Each cable passageway is to receive a cable extending through from the first side to the second side.

In another aspect of the invention, an electronic system includes a housing having an opening and an EMI shield mounted in the opening. The EMI shield includes at least one portion made of a deformable electrically conductive material. The at least one portion defines a plurality of cable passageways extending from a first side of the at least one portion to a second side of the at least one portion. The electronic system includes a plurality of cables. Each of the plurality of cables extends through a passageway of the plurality of passageways.

In another aspect, the invention includes a method for providing EMI shielding for an electronic system housing. The method includes positioning a plurality of EMI shields in an opening of an electronic system housing. Each of the plurality of EMI shields including at least one portion made of a deformable electrically conductive material. The at least one portion defines a plurality of cable passageways extending from a first side of the at least one portion to a second side of the at least one portion. The method also includes installing cables in the plurality of cable passageways of the plurality of EMI shields and compressing the at least one portions of the plurality of EMI shields with the plurality of cables installed in the passageways.

In another aspect of the invention, an electronic system includes a housing having an opening and an EMI shield mounted in the opening. The EMI shield includes deformable electrically conductive material and means for defining in the deformable electrically conductive material a plurality of cable passageways extending from a first side of the deformable electrically conductive material to a second side of the deformable electrically conductive material. Each cable passageway is for receiving a cable extending through from the first side to the second side.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted.

DETAILED DESCRIPTION

The following sets forth a detailed description of a mode for carrying out the invention. The description is intended to be illustrative of the invention and should not be taken to be limiting.

Figure 1:
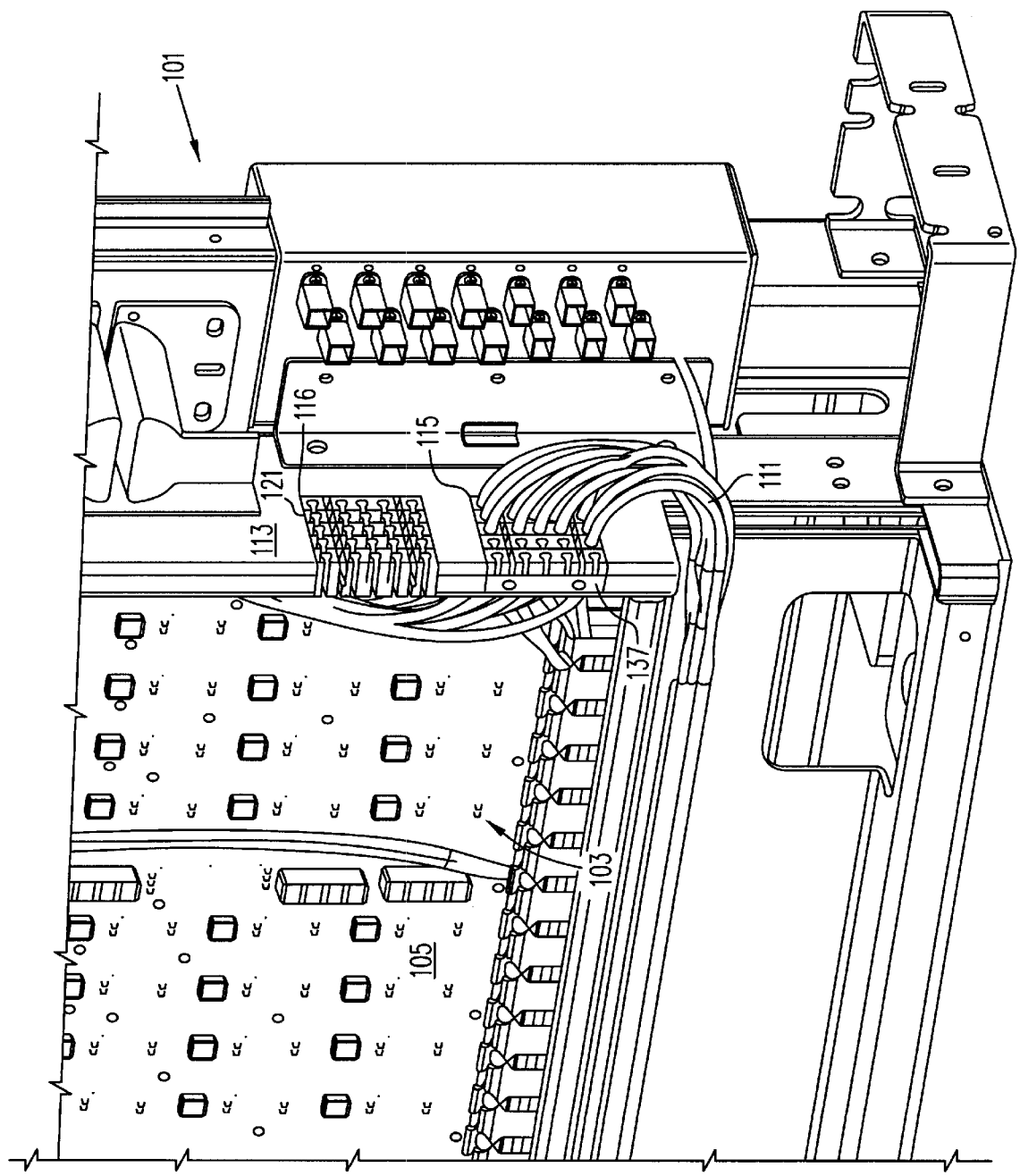
FIG. 1 is a partial perspective view showing an example of a plurality of EMI cable passthrough shields positioned in cable openings of an electronic system housing according to the present invention.

FIG. 1 shows a partial perspective view of a portion of a communication system housing for a communications system. Matrix bay 101 houses electronic components for a communication system such as, e.g., a wave length router-class, optical cross connect for a communications network. Matrix bay 101 includes a matrix card chassis 103 that houses electronic circuits such as matrix cards (not shown) mounted on the backside of backplane 105. During normal operations, the matrix cards and other electronic circuits (not shown) housed in matrix card chassis 103 produce EMI emissions. Matrix bay 101 includes a door (not shown) for enclosing matrix card bay 103. The door, when closed, provides EMI shielding for the circuits housed in chassis 103. Further examples of a communication system housing can be found in a patent application entitled "Fiber Optic Cable Connector Clip," having listed inventor Michael A. Mandry, a common assign, and a filing date of Jun. 9, 2000, all of which is hereby incorporated by reference in its entirety.

Matrix bay 101 includes a chassis wall 113 having cable openings 115 and 116 that allow numerous fiber optic cables and electrically conductive cables to enter matrix card chassis 103. To reduce EMI emissions escaping through openings 115 and 116, a number of EMI cable pass through shields 121 with cable passageways are mounted in vertically stacked orientations in openings 115 and 116. The EMI cable passthrough shields 121 include deformable, electrically conductive material that provide EMI shielding between the edge of openings 115 and 116 and cables 111. In FIG. 1, cables 1 11, are shown passing to the inside of matrix chassis 103 through the cable passageways of the EMI shields 121 mounted in opening 115. In the view of FIG. 1, no cables are shown passing through the cable passageways of the shields 121 mounted in opening 116.

Figure 2A:
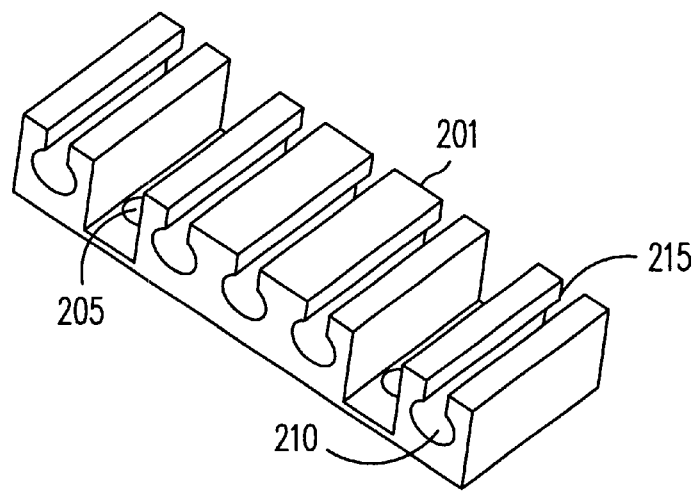
FIGS. 2A–2C are views of an example of an EMI cable passthrough shield according to the present invention.
Figure 2B:
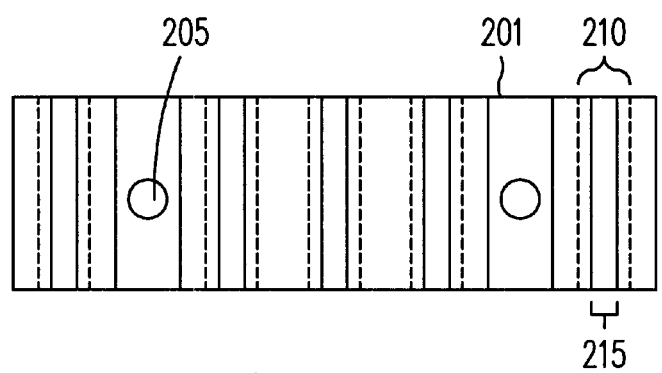
Figure 2C:
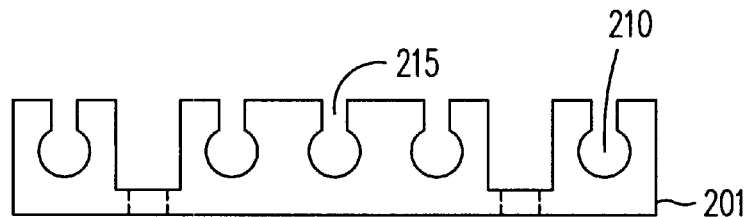

FIG. 2A is a perspective view of an example of an EMI cable passthrough shield having a plurality of cable passageways defined by deformable, electrically conductive material. FIG. 2B is a top view of shield 201, and FIG. 2C is a sideview of shield 201. The dimensions shown in FIGS. 2B and 2C are in inches.

EMI cable passthrough shield 201 is similar to shields 121 shown in FIG. 1. Shield 201 includes five cable passageways 210, each for receiving a cable. The diameter of each cable passageway may be sized according to the cable that is to pass through the passageway. In some embodiments, the passageways are made larger than the diameter of the cables that are to be received to allow for ease of installation. In some embodiments, the cable passageways are made smaller than the diameter of the cables that are to be received to minimize EMI emissions. With some embodiments, cable passageways are equal to the diameter of the cables that are to be received. Each cable passageway 210 includes a slot 215 that allows a cable to be inserted into the passageway 210. Shield 210 also includes mounting holes 205 for mounting the shield in an opening (See FIG. 6).

Shield 201 is molded from an electrically conductive material such as e.g., a conductive elastomeric material (ECE-93) which includes silicone, nickel, and carbon. However, other types of deformable electrically conductive material may be used such as, e.g., other types of electrically conductive elastomeric material and electrically conductive foam.

The length of each passageway 210 is longer than the diameter of the passageway. In FIG. 2, the length of each passageway is 0.675 inches and the diameter is 0.200 inches. Typically, the larger the length to diameter ratio, the greater the effectiveness of the EMI shielding of the shield. Because some fiber optic cables are not electrically conductive, the diameter of the cable provides a "hole" for EMI emissions to escape. Lengthening the cable path lengthens this "hole," thereby reducing the amount of EMI emissions passing through. However, the dependence of shielding effectiveness to passageway length reduces as the length of the passageway increases. The length of the cable passageways may be sized according to a desired reduction in EMI emissions levels.

Figure 3A:
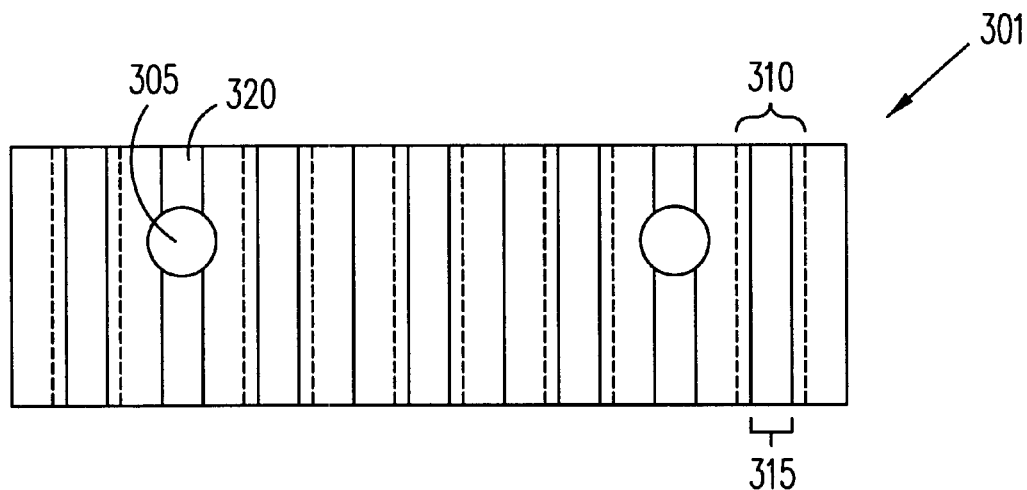
FIGS. 3A and 3B are views of another example of an EMI cable passthrough shield according to the present invention.
Figure 3B:
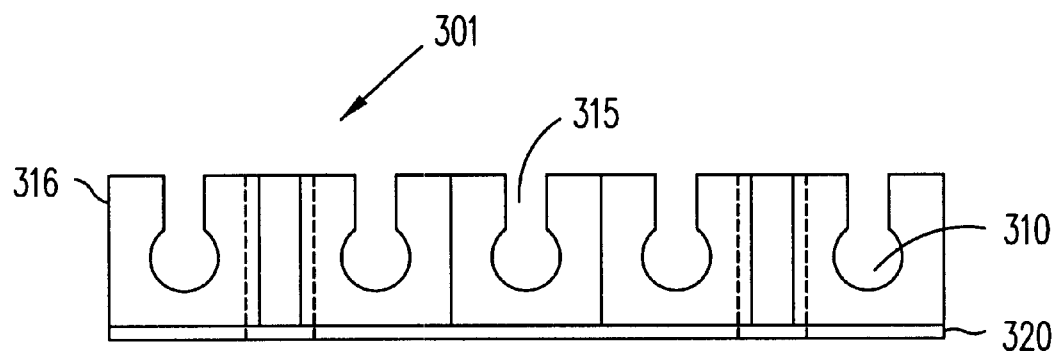

FIGS. 3A and 3B show a top view and a side view, respectively, of another example of an EMI cable passthrough shield according to the present invention. The dimensions shown in FIGS. 3A and 3B are in inches. EMI shield 301 includes five cable passageways 310, each with a slot 315 for cable insertion. Shield 301 includes five blocks 316 of deformable, electrically conductive material with each block including a cable passageway 310 and slot 315. Each block 316 is formed by extruding deformable, electrically conductive elastomeric material having the pattern shown by the side view of FIG. 3B and cutting the extruded material into the desired passageway lengths, which in FIG. 3A is 0.750 inches. Each block 316 is then attached with electrically conductive glue to a sheet (e.g., 320) of electrically conductive metal such as 16 gauge stainless steel, type 304, No. 2B finish per ASTM A 240. In another embodiment, each block 316 is cut from hollow rectangular strips sold under the trade number of 8862-0105-xx by the INSTRUMENT SPECIALTIES CORP. Shield 301 also includes mounting holes 305.

Figure 4A:
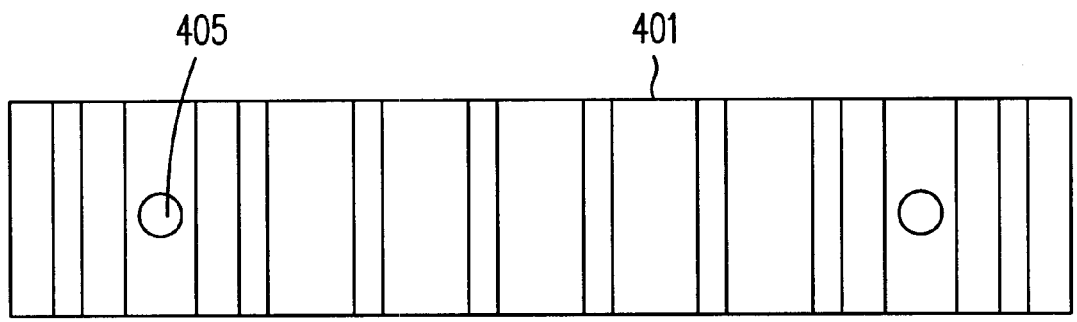
FIGS. 4A and 4B are views of another example of an EMI cable passthrough shield according to the present invention.
Figure 4B:
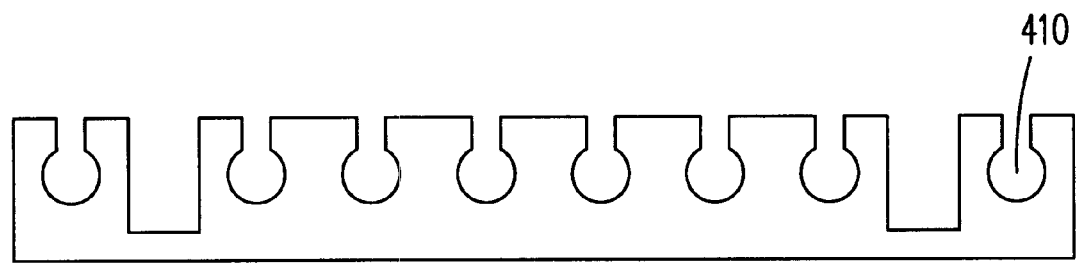

FIGS. 4A and 4B show top and side views, respectively, of another embodiment of an EMI cable passthrough shield. Shield 401 is formed by molding deformable, electrically conductive elastomeric material. Shield 401 includes 8 cable passageways 410 and two mounting holes 405.

Figure 5A:
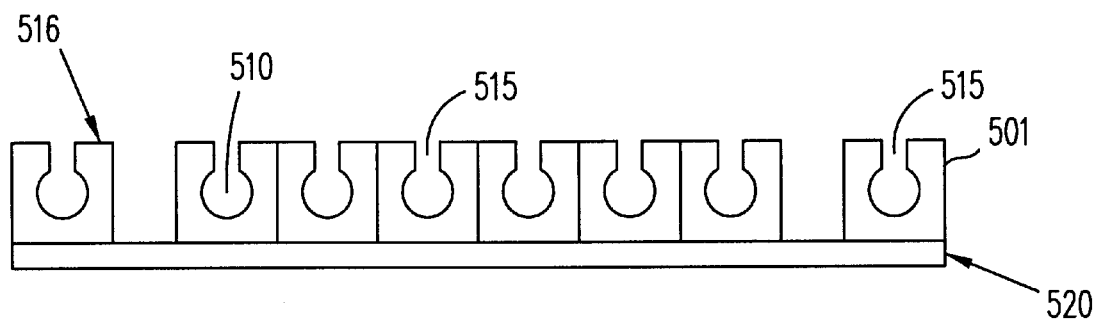
FIGS. 5A and 5B are views of another example of an EMI cable passthrough shield according to the present invention.
Figure 5B:
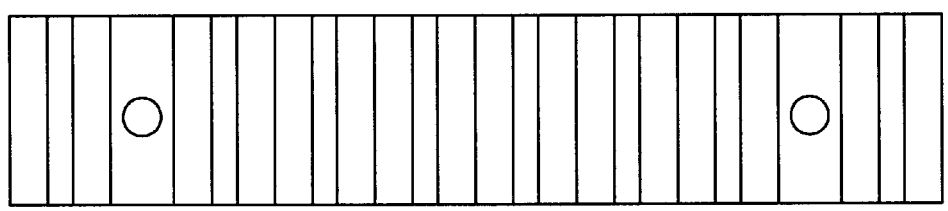

FIGS. 5A and 5B show side and top views, respectively, of another embodiment of an EMI cable passthrough shield. Shield 501 includes eight extruded blocks 516 of deformable, electrically conductive elastomeric material with each block 516 including a cable passageway 510 and slot 515. Each block 516 is attached with electrically conductive glue to metal plate 520. In one embodiment, metal plate 520 is an 11 gauge, 0.119 inch thick stainless steel plate.

Figure 6:
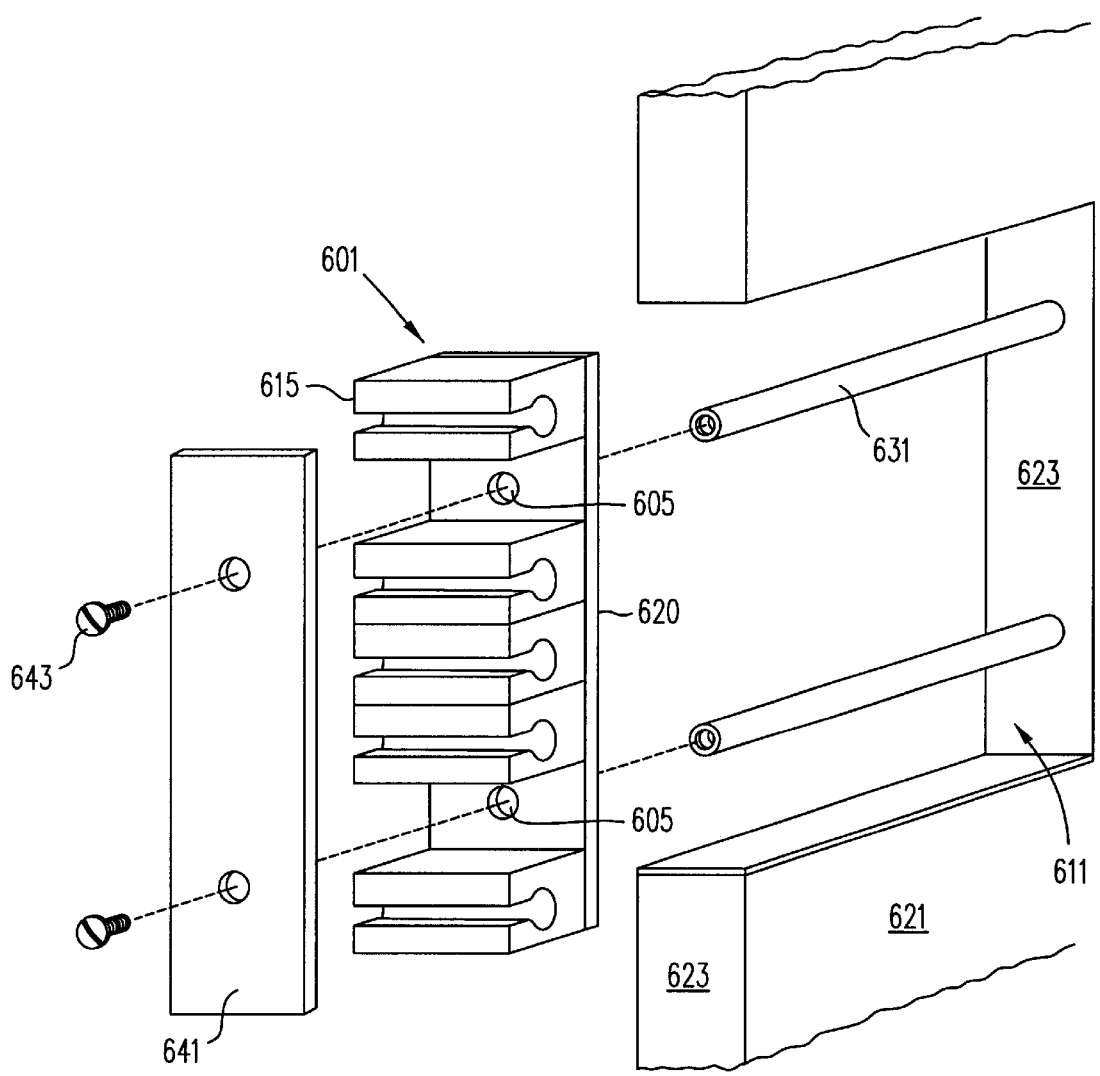
FIG. 6 is a partial perspective view of an electronic system housing showing an example of installation details for mounting an EMI cable passthrough shield in a cable opening according to the present invention.

FIG. 6 is a partial perspective view showing details for installing a EMI cable passthrough shield in a cable opening in a housing wall. Opening 611 is defined in housing wall 621. Flange 623 is integrally connected with wall 621. Two electrically conductive standoffs 631 are secured via screws (not shown) to flange 623. In one embodiment, standoffs 631 are galvanized steel hollow tubes with a threaded interior surface.

Shield 601 includes two holes 605 in plate 620 for mounting EMI shield 601 in opening 611. To position shield 601 in opening 611, shield 601 is initially positioned where standoffs 631 reside in holes 605. Afterwards, shield 601 is slid into opening 611 on standoffs 631 to a position where the back of plate 620 (relative to the view shown in FIG. 6) resides against flange 623.

After shield 601 is positioned in opening 611, cables (not shown) are inserted into the cable passageways 610 of shield 601 via slots 615. After a cable has been inserted into each of the passageways 610 of shield 601, a second shield (not shown) similar to shield 601 is positioned in opening 611, wherein the metal plate (e.g., 620) of the second shield resides against the side of shield 601 with slots 615. After a cable has been inserted into each passageway (e.g., 610) of the second shield, a third shield (not shown) similar to shield 601 is positioned in opening 611 wherein cable is inserted into its cable passageways. Additional shields may be added accordingly.

When opening 611 becomes filled with EMI cable passthrough shields and cables, clamp plate 641 is secured to standoffs 631 via screws 643 to secure the EMI cable passthrough shields in opening 611. Prior to securing plate 641 to standoffs 631, a portion of the last installed EMI shield extends out past flange 623. To install secure plate 641 to standoffs 631, plate 641 is pressed against the last installed EMI cable passthrough shield to provide a compressing force on the EMI cable passthrough shields (e.g., 601) against flange 623. This compressing force closes the slots 615 of the shields such that the cables (not shown) in the cable passageways are completely enclosed by the deformable elastomeric material. The compressing force also causes the deformable material to fill other gaps in opening 611. Referring back to FIG. 1, clamp plate 137 is shown in a secured position with respect to bay 101.

Figure 7:
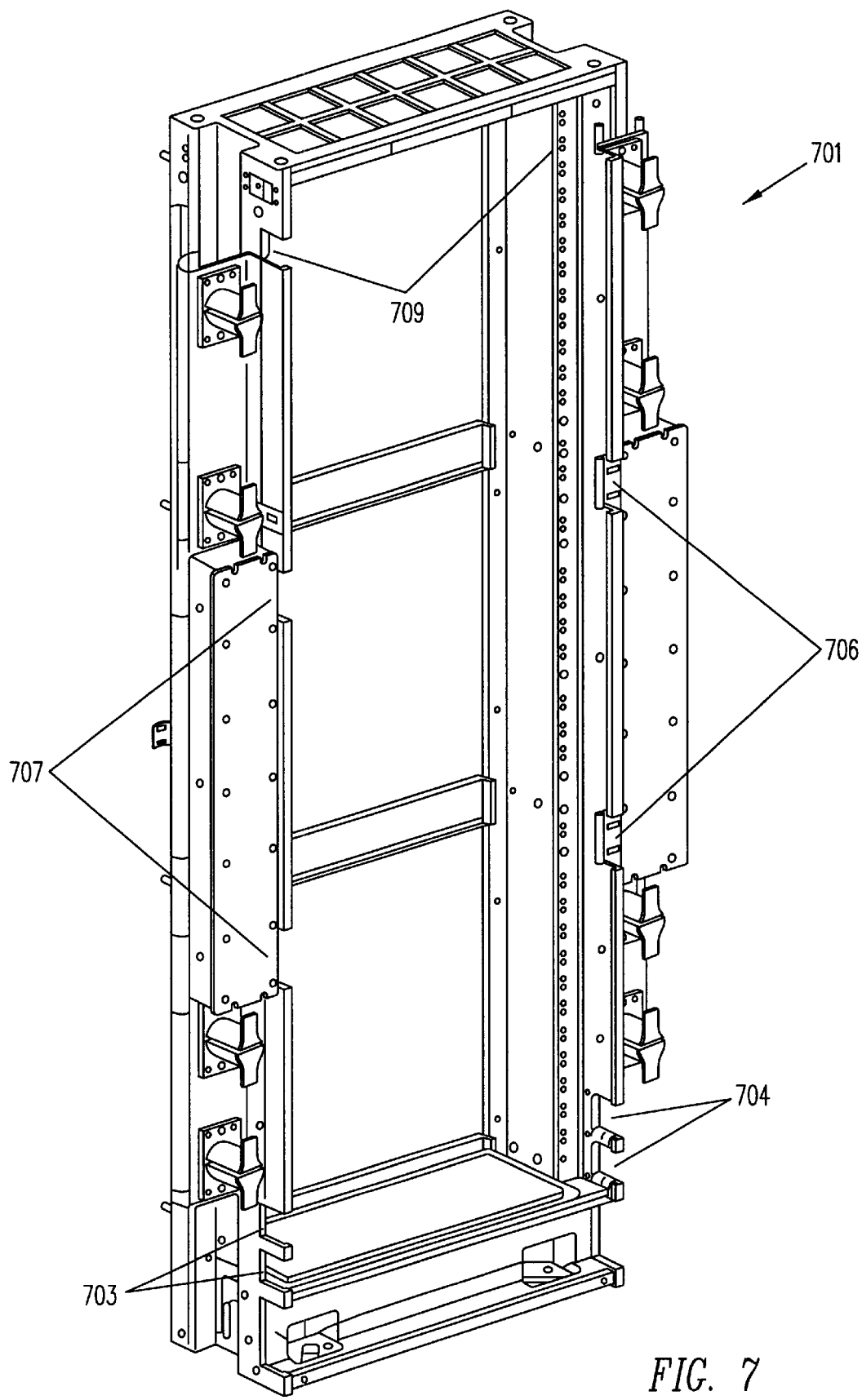
FIG. 7 is a perspective view of an example of electronic system housing structures according to the present invention.

FIG. 7 shows a perspective view of housing structures for a matrix bay. Matrix bay housing 701 includes multiple openings 703, 704, 706, 707, and 709 in its side panels for cable to passthrough. The number and size of EMI cable passthrough shields that can be positioned in an opening is dependent on the height and depth of the opening. For example, cable openings 703, 704, and 709 are shorter and deeper than cable openings 706 and 707. Accordingly, shorter EMI cable passthrough shields are mounted in openings 703, 704, and 709 than in openings 706 and 707. In one embodiment, five of the shorter EMI cable passthrough shields (e.g., 201 or 301) can be positioned in openings 703, 704, and 709 and three of the longer EMI cable passthrough shields (e.g., 401 or 501) can be positioned in openings 706 and 707. With other embodiments, EMI shields of other sizes may be utilized according to the requirements of the cable openings.

Referring back to FIGS. 3 and 5, the metal plates 320 and 520 of shields 301 and 501, respectively, have a length that is slightly less than the height of the opening in which the shields are to be mounted. Shields 201 and 401 may have a slightly longer length than the height of the openings to which they are to be mounted in that shields 301 and 501 are completely made of a deformable material.

An advantage of utilizing EMI cable pass through shields with deformable material is that the deformable material prevents cable chaffing by providing a cushion against the sharp edges of the cable openings.

An advantage of using multiple EMI cable passthrough shields is that the EMI shielding for a cable opening can be easily modified to accommodate different sizes of cables and different numbers of cables. For example, referring back to FIG. 1, each EMI cable passthrough shield 121 may include cable passageways of differing diameters to accommodate for different cable sizes. For example, the three inner EMI cable passthrough shields 121 located in opening 115 may include larger diameter cable passageways for larger diameter cables whereas the two outer EMI cable passthrough shields may include cable passageways of a smaller dimension for smaller diameter cables. Furthermore, with some embodiments, the cable passageways on an individual EMI cable passthrough shield may include cable passageways of different diameters.

For those occurrences where not all of the cable passageways are scheduled to be utilized, electrically conductive dummy plugs having the same sized diameter as a cable for which the passageway is design may be inserted into the passageway during the installation of the other cables. With other embodiments, some of the EMI shields may include solid portions for filling in those areas of an opening with no cables. Also shields with no cable passageways may be used where an entire row of passageways is not utilized.

Referring back to FIG. 1, cables 111 are shown extending through opening 115 in a two-dimensional array pattern. Positioning the cables in a two-dimensional array pattern allows for a higher density of cables in an area.

Those of skill in the art will recognize that, based upon the teachings herein, several modifications may be made to the embodiments shown in FIGS. 1–7. For example, an EMI cable passthrough shield according to the present invention may customized to fit any of a number of cable diameter sizes, cable opening sizes, and/or cable densities as required. Also, an EMI cable passthrough shield may be made out of other types of electrically conductive deformable material such as electrically conductive foam. Furthermore, an EMI cable passthrough shield may be mounted in a housing by other techniques such as with screws or latches. Furthermore, the cable passageways of an EMI cable passthrough shield may be arranged in other configurations. For example, the cable passageways may arranged in two rows where the slots for the first row are located on the opposite side of the shield from the slots of the second row.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. An EMI shield having cable passageways comprising:
   at least one portion made of a deformable electrically conductive material, the at least one portion defining a plurality of cable passageways extending from a first side of the at least one portion to a second side of the at least one portion, wherein each cable passageway is to receive a cable extending through from the first side to the second side;
   a plurality of slots extending from the first side to the second side to define an opening in a longitudinal side of each cable passageway of the plurality; and
   wherein the at least one portion is formed in a single piece.

2. The EMI shield of claim 1 wherein the material is deformable such that when pressure is applied to the at least one portion in at least a first and second opposing directions, a cable passageway that is defined by the at least one portion closes such that the deformable material defining a cable passageway completely encloses a cable.

3. The EMI shield of claim 1 wherein each of the plurality of cable passageways has a length and a diameter, where the length is greater than the diameter.

4. The EMI shield of claim 3 wherein the length is at least twice the diameter.

5. The EMI shield of claim 1 wherein the shield further defines at least one mounting hole that is positioned in a generally perpendicular orientation to the plurality of cable passageways.

6. The EMI shield of claim 1 wherein the deformable material includes conductive elastomeric material.

7. The EMI shield of claim 6 wherein the conductive elastomeric material is a combination of at least silicone, nickel, and carbon.

8. The EMI shield of claim 1 further comprising:
a metal plate, wherein the at least one portion is attached to the metal plate.

9. The EMI shield of claim 8 wherein the at least one portion includes a third side located between the first and second sides, the third side being attached to the metal plate.

10. The EMI shield of claim 1 wherein the plurality of passageways are generally aligned in a row.

11. An electronic system comprising:
a housing having an opening;
an EMI shield mounted in the opening, the EMI shield including
at least one portion made of a deformable electrically conductive material, the at least one portion defining a plurality of cable passageways extending from a first side of the at least one portion to a second side of the at least one portion,
a plurality of slots extending from the first side to the second side to define an opening in a longitudinal side of each cable passageway of the plurality; and
wherein the at least one portion is formed in a single piece; and
a plurality of cables, each of the plurality of cables extending through a respective passageway of the plurality of passageways.

12. The electronic system of claim 11 wherein the at least one portion is compressed such that the deformable material defining a cable passageway completely encloses a cable.

13. The electronic system of claim 11 wherein each of the plurality of cable passageways has a length and a diameter, where the length is greater than the diameter.

14. The electronic system of claim 13 wherein the length is at least twice the diameter.

15. The electronic system of claim 11 wherein the deformable material includes conductive elastomeric material.

16. The electronic system of claim 15 wherein the conductive elastomeric material is a combination of at least silicone, nickel, and carbon.

17. The electronic system of claim 11 further comprising:
at least one standoff extending at least partially across the opening, the EMI shield including at least one mounting hole positioned in a generally perpendicular orientation to the plurality of cable passageways, the standoff extending through a mounting hole of the at least one mounting holes.

18. The electronic system of claim 11 further comprising:
at least another EMI shield mounted in the opening, each of the at least another EMI shield including at least one portion made of a deformable electrically conductive material, the at least one portion defining a plurality of cable passageways extending from a first side of the at least one portion to a second side of the at least one portion;
wherein each of the plurality of cables extends through a passageway of the plurality of passageways of the at least another EMI shield.

19. The electronic system of claim 18 wherein each of the EMI shields is mounted in the opening in a stacked orientation.

20. The electronic system of claim 18 wherein the cables pass through the opening in the cable passageways of the EMI shields in a two dimensional array pattern.

21. The electronic system of claim 18 further comprising:
a clamp plate attached to the housing to compress the at least one portion of the EMI shields.

22. A method for providing EMI shielding for an electronic system housing comprising:
positioning a plurality of EMI shields in an opening of an electronic system housing, each of the plurality of EMI shields including at least one portion made of a deformable electrically conductive material, the at least one portion defining a plurality of cable passageways extending from a first side of the at least one portion to a second side of the at least one portion, and wherein the at least one portion is formed in a single piece;
installing a plurality of cables in the plurality of cable passageways of the plurality of EMI shields by inserting the plurality of cables through a plurality of slots extending from the first side to the second side to define an opening in a longitudinal side of each cable passageway of the plurality; and
compressing the at least one portion of the plurality of EMI shields with the plurality of cables installed in the passageways.

23. The method of claim 22 wherein the compressing further includes compressing the at least one portion of the EMI shields such that the deformable material completely encloses a cable.

24. The method of claim 22 wherein the positioning and the installing further include:
positioning a first EMI shield of the plurality of EMI shields in the opening;
installing each of a first plurality of cables of the plurality of cables in a cable passageway of the first EMI shield;
positioning a second EMI shield of the plurality of EMI shields in the opening;
installing each of the second plurality of cables of the plurality of cables in a cable passageway of the second EMI shield.

25. The method of claim 22 wherein the positioning further includes mounting the EMI shields on standoffs that extend at least partially across the opening.

26. The method of claim 25 wherein the compressing further includes attaching a clamp to the standoffs against an end EMI shield of the plurality.

27. An electronic system comprising:
a housing having an opening; and
an EMI shield mounted in the opening, the EMI shield including:
deformable electrically conductive material, wherein the material is formed in a single piece; and
means for defining in the deformable electrically conductive material a plurality of cable passageways extending from a first side of the deformable electrically conductive material to a second side of the deformable electrically conductive material, each cable passageway for receiving a cable extending through from the first side to the second side; and
means for defining in the deformable electrically conductive material a plurality of slots extending from the first side to the second side to define an opening in a longitudinal side of each cable passageway of the plurality.

28. The electronic system of claim 27 wherein the deformable material includes conductive elastomeric material.

* * * * *